United States Patent
An

(10) Patent No.: US 9,209,236 B2
(45) Date of Patent: Dec. 8, 2015

(54) ORGANIC LIGHT-EMITTING DISPLAY APPARATUS COMPRISING A DEFAULT DETECTING CAPACITOR

(71) Applicant: SAMSUNG DISPLAY CO., LTD., Yongin, Gyeonggi-Do (KR)

(72) Inventor: Chi-Wook An, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/151,745

(22) Filed: Jan. 9, 2014

(65) Prior Publication Data

US 2015/0014648 A1 Jan. 15, 2015

(30) Foreign Application Priority Data

Jul. 12, 2013 (KR) .................. 10-2013-0082440

(51) Int. Cl.
*H01L 27/32* (2006.01)
*H01L 51/52* (2006.01)

(52) U.S. Cl.
CPC .......... *H01L 27/3265* (2013.01); *H01L 51/5256* (2013.01)

(58) Field of Classification Search
CPC . H01L 27/3225; H01L 27/3265; H01L 28/40; H01L 28/20; H01L 51/5256

USPC ........................................................... 257/40
See application file for complete search history.

(56) References Cited

U.S. PATENT DOCUMENTS

| 6,084,579 | A | * | 7/2000 | Hirano | 345/205 |
| 2006/0181199 | A1 | * | 8/2006 | Lee et al. | 313/503 |
| 2007/0182314 | A1 | * | 8/2007 | Oh et al. | 313/500 |
| 2010/0020041 | A1 | | 1/2010 | Park et al. | |
| 2014/0320136 | A1 | * | 10/2014 | Cho | 324/414 |
| 2014/0339530 | A1 | * | 11/2014 | Hente et al. | 257/40 |

FOREIGN PATENT DOCUMENTS

| KR | 10-2000-0019137 A | 4/2000 |
| KR | 10-2008-0084424 A | 9/2008 |
| KR | 10-2012-0012891 A | 2/2012 |

* cited by examiner

*Primary Examiner* — Mamadou Diallo
*Assistant Examiner* — Christina Sylvia
(74) *Attorney, Agent, or Firm* — Christie, Parker & Hale, LLP

(57) ABSTRACT

An organic light-emitting display apparatus includes a substrate; a device/wiring layer formed on the substrate, including a plurality of thin film transistors (TFTs); an emitting layer formed on the device/wiring layer, including a lower electrode of a capacitor and a plurality of organic light-emitting diodes (OLEDs); an encapsulating layer formed to cover the emitting layer; and an upper electrode of the capacitor formed on the encapsulating layer.

8 Claims, 5 Drawing Sheets

ORGANIC LIGHT-EMITTING DISPLAY APPARATUS COMPRISING A DEFAULT DETECTING CAPACITOR

CROSS-REFERENCE TO RELATED APPLICATION

This application claims priority to and the benefit of Korean Patent Application No. 10-2013-0082440, filed on Jul. 12, 2013, in the Korean Intellectual Property Office, the content of which is incorporated herein in its entirety by reference.

BACKGROUND

1. Field

One or more embodiments of the present invention relate to an organic light-emitting display apparatus and a method of manufacturing the same.

2. Description of the Related Art

Organic light-emitting display apparatuses provide high-quality features such as wide viewing angles, high contrast ratio, quick response time, and low power consumption. Therefore, the organic light-emitting display apparatuses may be applied to personal portable devices such as MP3 players or cellular phones, televisions, and so on.

Also, since the organic light-emitting display apparatuses are self-emissive and do not require a separate light source, thicknesses and weights of the organic light-emitting display apparatuses may be reduced.

However, the organic light-emitting display apparatuses may be deteriorated due to external moisture or oxygen, and the like. Therefore, it is important to prevent external moisture or oxygen from penetrating into the organic light-emitting display apparatuses.

SUMMARY

One or more aspects of the present invention are directed toward an organic light-emitting display apparatus that may detect a fault at an early stage and a method of manufacturing the same, and more particularly, toward an organic light-emitting display apparatus that includes a capacitor that may detect faults, and a method of manufacturing the same.

Additional aspects will be set forth in part in the description which follows and, in part, will be apparent from the description, or may be learned by practice of the presented embodiments.

According to one or more embodiments of the present invention, an organic light-emitting display apparatus includes a substrate; a device/wiring layer on the substrate, including a plurality of thin film transistors (TFTs); an emitting layer on the device/wiring layer, including a lower or first capacitor electrode and a plurality of organic light-emitting diodes (OLEDs); an encapsulating layer covering the emitting layer; and an upper or second capacitor electrode on the encapsulating layer, wherein the first and second capacitor electrodes and encapsulating layer together define a capacitor.

The first capacitor electrode is on an edge of the device/wiring layer, separated from and surrounding the plurality of OLEDs.

The organic light-emitting diode is formed by sequentially stacking a first OLED electrode, an organic layer, and a second OLED electrode.

The first capacitor electrode and the second OLED electrode are concurrently formed.

The first capacitor electrode and the second capacitor electrode face each other.

The encapsulating layer is formed by alternately stacking at least one layer of an inorganic layer and an organic layer.

The inorganic layer includes silicon oxide, silicon nitride, silicon oxynitride, aluminum oxide, aluminum nitride, aluminum oxynitride, titanium oxide, titanium nitride, tantalum oxide, tantalum nitride, hafnium oxide, hafnium nitride, zirconium oxide, zirconium nitride, cerium oxide, cerium nitride, tin oxide, tin nitride, or magnesium oxide.

The organic layer includes an acrylic-based resin, a methacrylic-based resin, an isoprene-based resin, a vinyl-based resin, an epoxy-based resin, a urethane-based resin, a cellulose-based resin, a perylene-based resin, an imide-based resin, or a compound thereof.

According to one or more embodiments of the present invention, an organic light-emitting display apparatus includes a substrate; a device/wiring layer on the substrate, including a first capacitor electrode and a plurality of thin film transistors (TFTs); an emitting layer on the device/wiring layer, including a plurality of organic light-emitting diodes (OLEDs); an encapsulating layer covering the emitting layer; and a second capacitor electrode on the encapsulating layer, wherein the first and second capacitor electrodes and encapsulating layer together define a capacitor.

The first capacitor electrode is on an edge of the substrate, separated from and surrounding the plurality of TFTs.

The plurality of TFTs includes a semiconductor layer on the substrate; a gate insulating film on the semiconductor layer; a gate electrode on the gate insulating film; an interlayer insulating film on the gate electrode; source and drain electrodes on the interlayer insulating film and connected to the semiconductor layer by penetrating through the interlayer insulating film and the gate insulating film; and a planarization film on the substrate to cover the source and drain electrodes.

The first capacitor electrode is on the gate insulating film and separated from the gate electrode.

The first capacitor electrode is on the interlayer insulating film and separated from the source and drain electrodes.

The first capacitor electrode and the second capacitor electrode face each other.

According to one or more embodiments of the present invention, a method of manufacturing an organic light-emitting display apparatus includes preparing a substrate; forming a device/wiring layer including a plurality of thin film transistors (TFTs) on the substrate; forming an emitting layer including a plurality of organic light-emitting diodes (OLEDs) and a lower electrode of a capacitor on the device/wiring layer; forming an encapsulating layer on the emitting layer; and forming an upper electrode of the capacitor on the encapsulating layer.

The lower electrode of the capacitor is formed on an edge of the device/wiring layer, separated from and surrounding the plurality of OLEDs.

The organic light-emitting diode is formed by sequentially stacking a first OLED electrode, an organic layer, and a second OLED electrode that is concurrently formed with the lower electrode of the capacitor.

According to one or more embodiments of the present invention, a method of manufacturing an organic light-emitting display apparatus includes preparing a substrate; forming a device/wiring layer including a lower electrode of a capacitor and a plurality of thin film transistors (TFTs) on the substrate; forming an emitting layer including a plurality of organic light-emitting diodes (OLEDs) on the device/wiring layer; forming an encapsulating layer on the emitting layer to cover the emitting layer; and forming an upper electrode of the capacitor on the encapsulating layer.

The forming of the device/wiring layer includes forming a semiconductor layer on the substrate; forming a gate insulating film on the semiconductor layer; forming a gate electrode and the lower electrode of the capacitor on the gate insulating film; forming an interlayer insulating film on the gate electrode and the lower electrode of the capacitor; forming source and drain electrodes on the interlayer insulating film and connected to the semiconductor layer by penetrating through the interlayer insulating film and the gate insulating film; and forming a planarization film on the substrate to cover the source and drain electrodes.

The forming of the device/wiring layer includes forming a semiconductor layer on the substrate; forming a gate insulating film on the semiconductor layer; forming a gate electrode on the gate insulating film; forming an interlayer insulating film on the gate electrode; forming source and drain electrodes on the interlayer insulating film and connected to the semiconductor layer by penetrating through the interlayer insulating film and the gate insulating film so as to be connected to the semiconductor layer, and forming the lower electrode of the capacitor on the interlayer insulating film; and forming a planarization film on the substrate to cover the source and drain electrodes, and the lower electrode of the capacitor.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1:
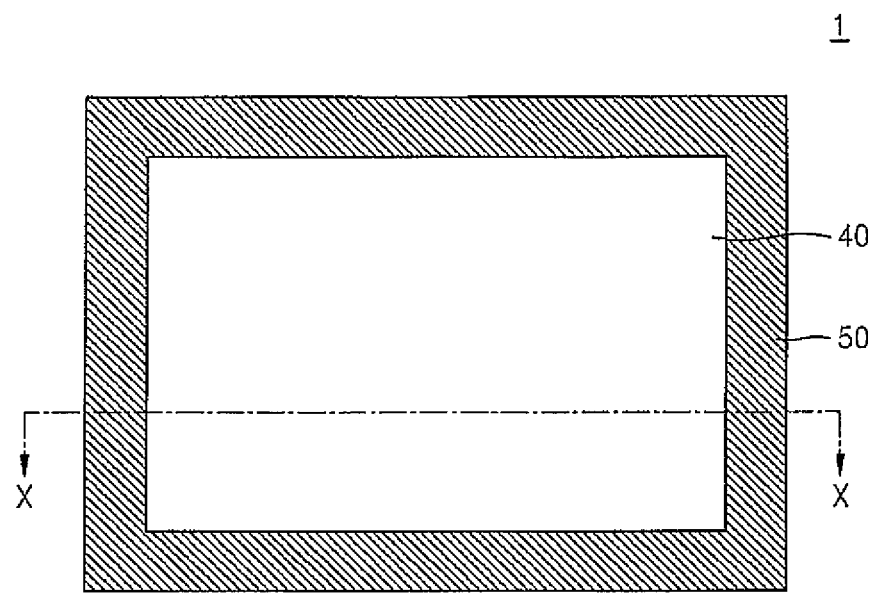
FIG. 1 is a schematic plan view illustrating an organic light-emitting display apparatus, according to an embodiment of the present invention.

The attached drawings, in which example embodiments of the present invention are shown, should be used as a reference to sufficiently understand the present invention, the merits thereof, and the objectives accomplished by the implementation of the present invention.

As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the present invention refers to "one or more embodiments of the present invention." It will also be understood that when a layer is referred to as being "on" another layer or substrate, it can be directly on the other layer or substrate, or intervening layers may also be present.

Hereinafter, the present invention will be described in more detail by explaining one or more embodiments of the present invention with reference to the attached drawings. Like reference numerals in the drawings denote like elements.

Figure 2:
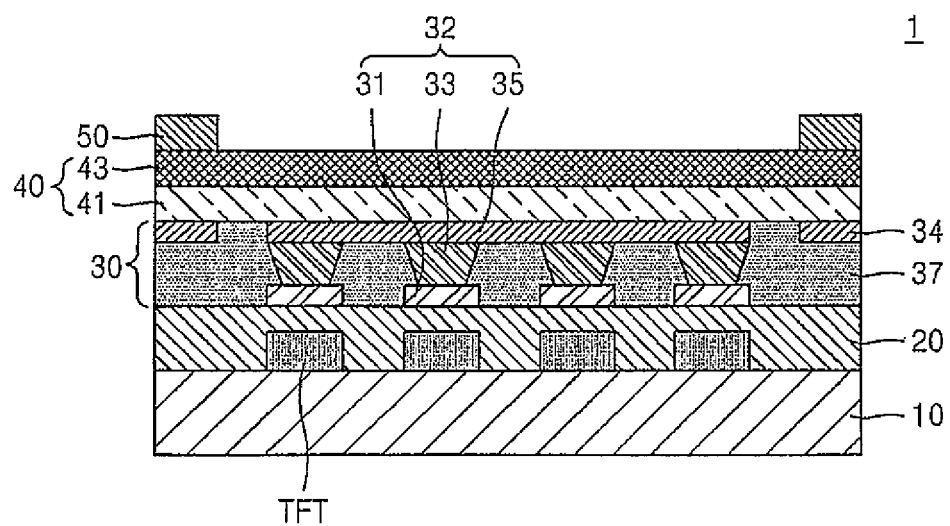
FIG. 2 is a schematic cross-sectional view illustrating the organic light-emitting display apparatus taken along a line X-X of FIG. 1.

FIG. 1 is a schematic plan view illustrating an organic light-emitting display apparatus 1, according to an embodiment of the present invention. FIG. 2 is a schematic cross-sectional view illustrating the organic light-emitting display apparatus 1 taken along the line X-X of FIG. 1.

Referring to FIGS. 1 and 2, the organic light-emitting display apparatus 1 according to the present embodiment includes a substrate 10; a device/wiring layer 20 including a plurality of thin film transistors (TFTs); an emitting layer (EML) 30 including a plurality of organic light-emitting diodes (OLEDs) 32 and a lower or first electrode 34 of a capacitor; an encapsulating layer 40 covering the EML 30; and an upper or second electrode 50 of the capacitor, disposed on the encapsulating layer 40.

According to the present embodiment, the lower and upper electrodes 34 and 50 respectively are the lower and upper electrodes of the capacitor for estimating the capacitance of the organic light-emitting display apparatus 1. A capacitance value may be used to determine whether or not external impurities such as moisture have penetrated into the organic light-emitting display apparatus 1. Specifically, when impurities such as moisture or oxygen penetrate into the organic light-emitting display apparatus 1, a thickness between the lower and upper electrodes 34 and 50 is changed. Therefore, based on variations in a capacitance value due to the change in thickness, it is possible to promptly determine whether or not the organic light-emitting display apparatus 1 is faulty.

The substrate 10 may be formed by using transparent glass having $SiO_2$ as a main element, or other various suitable materials such as plastic materials or metal materials. Alternatively, the substrate 10 may be formed of a plastic material that may form a curved surface and has improved heat resistance and durability, such as polyethylene etherphthalate, polyethylene naphthalate, polycarbonate, polyacrylate, polyetherimide, polyethersulfone, or polyimide. However, the material of the substrate 10 is not limited thereto, and various flexible materials may be used.

The device/wiring layer 20, provided on the substrate 10, may include a plurality of TFTs, which may be driving TFTs to drive the plurality of OLEDs 32 formed in the EML 30, or switching TFTs.

The EML 30 is formed on the device/wiring layer 20, and includes the OLED 32 and the lower electrode 34.

The OLED 32 displays an image by emitting light according to driving signals received from the TFT of the device/wiring layer 20, and includes a first electrode 31, an organic layer 33, and a second electrode 35 which are sequentially stacked.

The first electrode 31 functions as an anode, and the second electrode 35 functions as a cathode. However, the polarities of the first and second electrodes 31 and 35 may be the opposite.

The first electrode 31 may be provided as a transparent electrode or a reflective electrode. When provided as a transparent electrode, the first electrode 31 may include indium tin oxide (ITO), indium zinc oxide (IZO), zinc oxide (ZnO), or indium oxide ($In_2O_3$). When provided as a reflective electrode, the first electrode 31 may include a reflective layer formed of silver (Ag), magnesium (Mg), aluminum (Al), platinum (Pt), palladium (Pd), gold (Au), nickel (Ni), neodymium (Nd), iridium (Ir), chromium (Cr), or an alloy thereof; and a transparent layer formed of ITO, IZO, ZnO, or $In_2O_3$.

The second electrode 35 may also be provided as a transparent electrode or a reflective electrode. When provided as a transparent electrode, the second electrode 35 may include a layer formed by stacking lithium (Li), calcium (Ca), LiF/Ca, LiF/Al, Al, Mg, or an alloy thereof toward an intermediate layer; and an auxiliary electrode or a bus electrode line formed of a transparent conductive material such as ITO, IZO, ZnO, or $In_2O_3$.

The first electrode 31, which is patterned in each sub-pixel, is electrically connected to the TFT of each sub-pixel. In this case, the second electrode 35 may be formed as a common electrode that extends over all sub-pixels and is connected to each other (as a continuous layer). The EML 30 may further include an insulating layer such as a pixel defining layer (PDL) 37 as shown in FIG. 2. In this case, at least a portion of the first electrode 31 may not be covered by the PDL 37, and the second electrode 35 may be disposed to cover the PDL 37. If the device/wiring layer 20 does not include the TFT in each sub-pixel, the first and second electrodes 31 and 35 may be patterned as a crossing stripe pattern and thus may perform as a passive matrix (PM) driver.

The organic layer 33 is disposed between the first and second electrodes 31 and 35.

The organic layer 33 may include a low-molecular weight organic material or a high-molecular weight organic material. When the organic layer 33 includes a low-molecular weight organic material, a hole injection layer (HIL), a hole transport layer (HTL), an organic emission layer, an electron transport layer (ETL), and an electron injection layer (EIL) may be formed as a single layer or a stacked structure. Various suitable organic materials such as copper phthalocyanine (CuPc), N,N'-Di(naphthalene-1-y1)-N,N'diphenyl-benzidine (NPB), or tris-8-hydroxyquinoline aluminum (Alq3) may be used. A low-molecular weight organic material may be deposited by using masks and a vacuum deposition method. When the organic layer 33 includes a high-molecular weight organic material, the organic layer 33 may be formed as a structure including the HTL and the organic emission layer. The HTL may be formed by using poly-(2,4)-ethylene-dihydroxy thiophene (PEDOT), and the organic emission layer may be formed of a poly-phenylenevinylene (PPV)-based high-molecular weight organic material, or a polyfluorene-based high-molecular weight organic material.

The lower electrode 34 is the lower electrode of the capacitor for estimating the capacitance of the organic light-emitting display apparatus 1.

The lower electrode 34 is separated from the OLED 32.

The lower electrode 34 may be concurrently formed with the common electrode, i.e., the second electrode 35 that extends over all the sub-pixels and is connected to each other. In this case, the lower electrode 34 may be disposed on the PDL 37, as shown in FIG. 2. Also, the lower electrode 34 may be formed by using the same material as that of the second electrode 35.

The encapsulating layer 40 is formed to completely cover the EML 30. Since the OLED 32 is easily deteriorated due to external moisture or oxygen, the encapsulating layer 40 prevents external oxygen or moisture from penetrating into the EML 30.

The encapsulating layer 40 may be formed by alternately stacking at least one layer of an inorganic layer 41 and an organic layer 43. The inorganic layer 41 may be formed of silicon oxide, silicon nitride, silicon oxynitride, aluminum oxide, aluminum nitride, aluminum oxynitride, titanium oxide, titanium nitride, tantalum oxide, tantalum nitride, hafnium oxide, hafnium nitride, zirconium oxide, zirconium nitride, cerium oxide, cerium nitride, tin oxide, tin nitride, or magnesium oxide. A suitable (or optimum) thickness of the inorganic layer 41 may be determined according to the productivity or properties of the organic light-emitting display apparatus. Since the inorganic layer 41 is thin but highly dense, the inorganic layer 41 may function as a barrier against moisture and oxygen.

The organic layer 43 may be formed of an acrylic-based resin, a methacrylic-based resin, an isoprene-based resin, a vinyl-based resin, an epoxy-based resin, a urethane-based resin, a cellulose-based resin, a perylene-based resin, an imide-based resin, or a compound (or a mixture) thereof. A suitable (e.g., an optimum) thickness of the organic layer 43 may be determined according to the properties of the organic layer 43, and the productivity or properties of the organic light-emitting display apparatus. The organic layer 43 may reduce stress in the inorganic layer 41 and planarize the inorganic layer 41.

The encapsulating layer 40 may be formed by using various suitable deposition methods such as sputtering, thermal evaporation, chemical vapor deposition (CVD), plasma enhanced chemical vapor deposition (PECVD), ion beam assisted deposition (IBAD), atomic layer deposition (ALD), or the like.

The upper electrode 50 is provided on the encapsulating layer 40. The upper electrode 50 is formed on an edge of the encapsulating layer 40 so as to correspond to (i.e., face) the lower electrode 34.

The upper electrode 50 is the upper electrode of the capacitor for estimating the capacitance of the organic light-emitting display apparatus 1. A width of the upper electrode 50 may be formed to be the same as that of the lower electrode 34, but is not limited thereto. The width of the upper electrode 50 may be different from that of the lower electrode 34.

The upper electrode 50 may be formed by using the same material as that of the lower electrode 34.

The encapsulating layer 40 disposed between the lower and upper electrodes 34 and 50 functions as a dielectric material of the capacitor. When external oxygen or moisture penetrates into the encapsulating layer 40, the thickness of the encapsulating layer 40 is changed.

Therefore, the capacitance may be estimated according to variations in the thickness of the encapsulating layer 40. Even when it is difficult to detect a fault with the naked eye, early detection of a progressive error in the organic light-emitting display apparatus 1 is possible by estimating the capacitance.

FIGS. 3 through 6 are schematic cross-sectional views illustrating a method of manufacturing the organic light-emitting display apparatus 1, according to an embodiment of the present invention.

Figure 3:
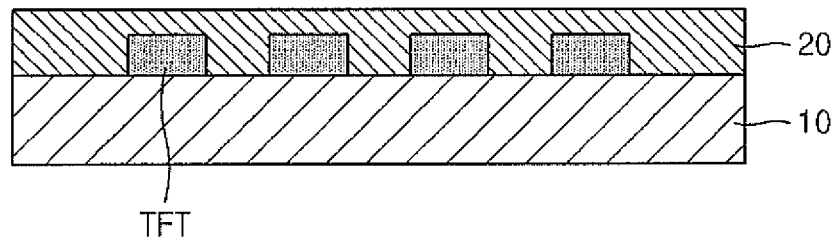
FIGS. 3 through 6 are schematic cross-sectional views illustrating a method of manufacturing the organic light-emitting display apparatus, according to an embodiment of the present invention.

Referring to FIG. 3, the substrate 10 is prepared. The substrate 10 may be formed by using transparent glass having $SiO_2$ as a main element, or other various suitable materials such as plastic materials or metal materials. Alternatively, the substrate 10 may be formed of a plastic material that may form a curved surface and have improved heat resistance and durability, such as polyethylene etherphthalate, polyethylene naphthalate, polycarbonate, polyacrylate, polyetherimide, polyethersulfone, or polyimide. However, the material of the substrate 10 is not limited thereto, and various flexible materials may be used.

Next, the device/wiring layer 20 is formed on the substrate 10.

The device/wiring layer 20 includes the plurality of TFTs, which drive the plurality of OLEDs 32 formed in the EML 30.

Figure 4:
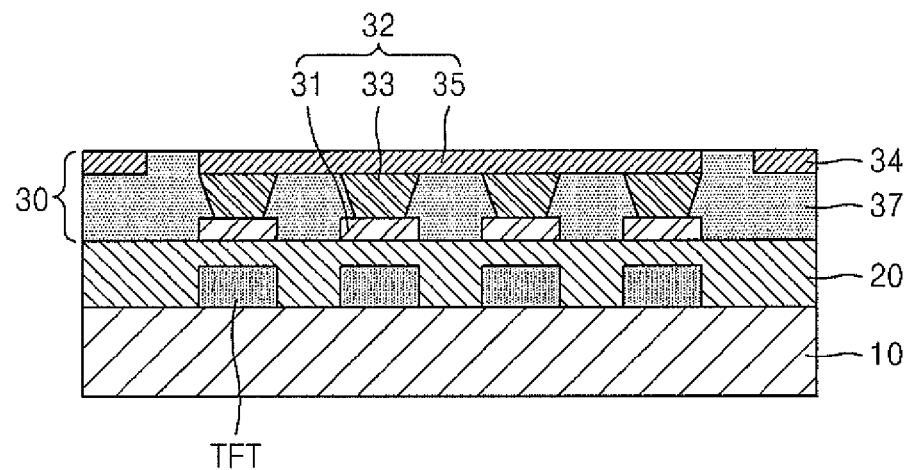

Referring to FIG. 4, the plurality of OLEDs 32 and the insulating layer such as the pixel defining layer (PDL) 37 are formed on the device/wiring layer 20. The lower electrode 34 is formed on the insulating layer such as a pixel defining layer (PDL) 37.

The OLED 32 includes the first electrode 31 that is electrically connected to the TFT of each sub-pixel; the second electrode 35 that functions as a common electrode that extends over all sub-pixels and is connected to each other; and the organic layer 33 that is disposed between the first and second electrodes 31 and 35.

The lower electrode 34 is formed to be separated from and surrounding the plurality of OLEDs 32. Also, the lower electrode 34 and the second electrode 35 may be concurrently (e.g., simultaneously) formed, and may be formed by using the same material. The lower electrode 34 is the lower electrode of the capacitor for estimating the capacitance.

Figure 5:
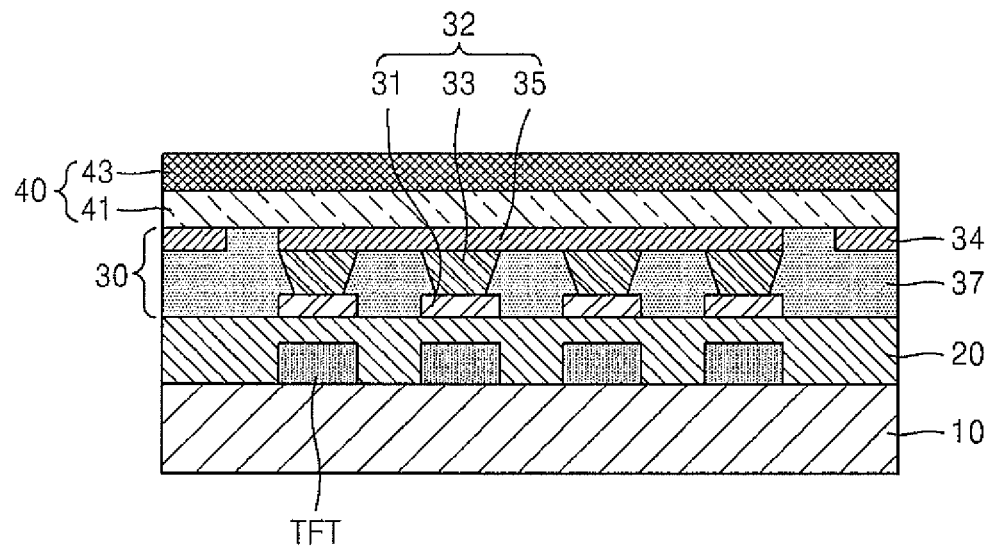

Referring to FIG. 5, the encapsulating layer 40 is formed to cover the OLED 32 and the lower electrode 34.

The encapsulating layer 40 may be formed by alternately stacking at least one layer of the inorganic layer 41 and organic layer 43. Since the inorganic layer 41 is thin but highly dense, the inorganic layer 41 may function as a barrier against moisture and oxygen. The organic layer 43 may reduce stress in the inorganic layer 41 and planarize the inorganic layer 41.

The encapsulating layer 40 may be formed by using various suitable deposition methods such as sputtering, thermal evaporation, chemical vapor deposition (CVD), plasma enhanced chemical vapor deposition (PECVD), ion beam assisted deposition (IBAD), atomic layer deposition (ALD), or the like.

Figure 6:
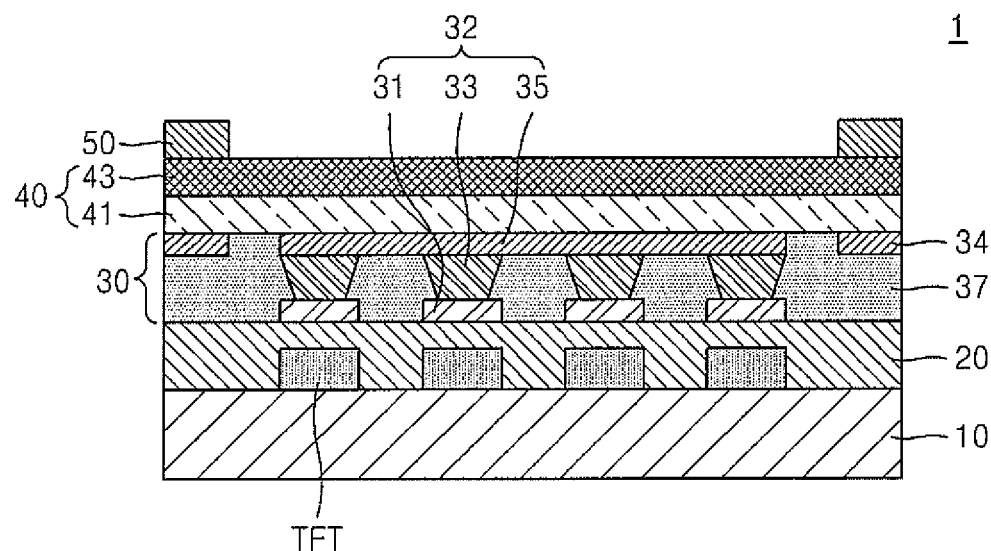

Referring to FIG. 6, the upper electrode 50 is formed on an edge of the encapsulating layer 40 so as to correspond to (or face) the lower electrode 34.

The upper electrode 50 is the upper electrode of the capacitor for estimating the capacitance of the organic light-emitting display apparatus 1.

A width of the upper electrode 50 may be formed to be the same as that of the lower electrode 34, but is not limited thereto. The width of the upper electrode 50 may be different from that of the lower electrode 34.

According to an inventive concept of the present invention, since the second electrode 35 and the lower electrode 34 may be concurrently (e.g., simultaneously) formed, a manufacturing process of the organic light-emitting display apparatus 1 may be simplified. Also, since the upper and lower electrodes 50 and 34 of the capacitor are formed in the upper and lower portions of the encapsulating layer 40, the capacitance may be measured according to variations in the thickness of the encapsulating layer 40. Thus, it is possible to promptly detect whether or not external moisture or oxygen has penetrated into the organic light-emitting display apparatus 1.

Figure 7:
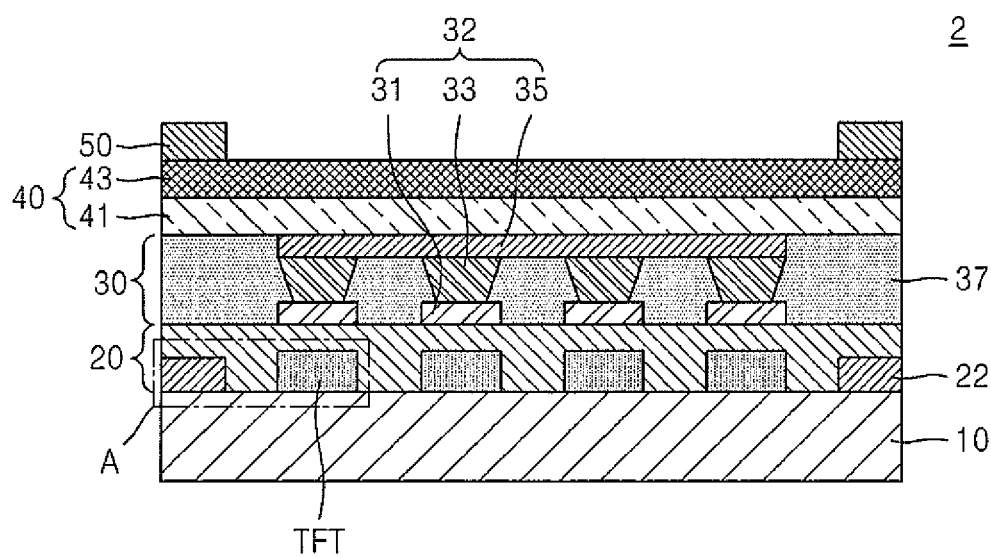
FIG. 7 is a schematic cross-sectional view illustrating an organic light-emitting display apparatus, according to another embodiment of the present invention.

FIG. 7 is a schematic cross-sectional view illustrating an organic light-emitting display apparatus 2, according to another embodiment of the present invention. Like reference numerals in FIGS. 2 and 7 denote like elements, and thus descriptions thereof will be omitted.

Referring to FIG. 7, the organic light-emitting display apparatus 2 according to the present embodiment includes the substrate 10, the device/wiring layer 20 including the plurality of TFTs and a lower electrode 22, the EML 30 including the plurality of OLEDs 32, the encapsulating layer 40 covering the EML 30, and the upper electrode 50 disposed on the encapsulating layer 40.

The device/wiring layer 20, provided on the substrate 10, includes a plurality of TFTs, which drive the plurality of OLEDs 32 formed in the EML 30, and the lower electrode 22.

The lower electrode 22 functions as a lower electrode of a capacitor for estimating the capacitance of the organic light-emitting display apparatus 2.

Figure 8:
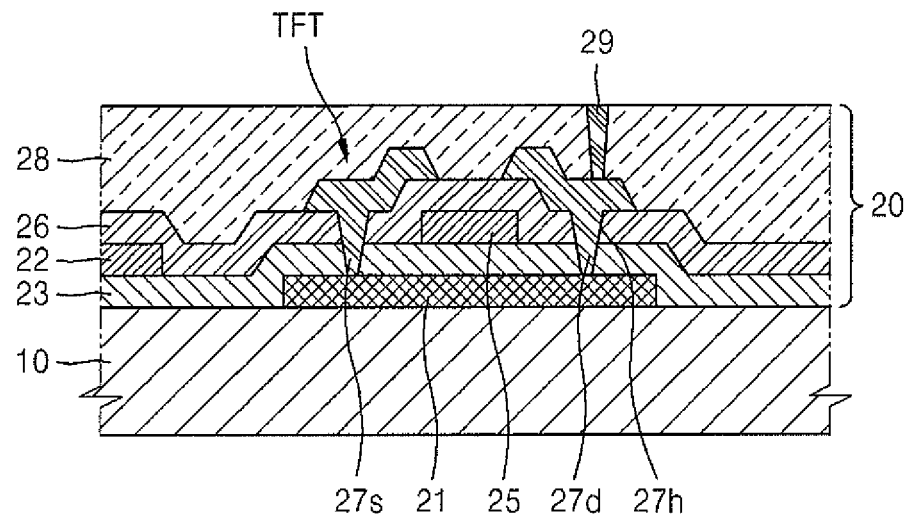
FIG. 8 is an expanded view of portion A of FIG. 7, according to an embodiment of the present invention.

The lower electrode 22 may be concurrently (e.g., simultaneously) formed with a gate electrode 25 of the TFT in FIG. 8. Alternatively, the lower electrode 22 may be concurrently (e.g., simultaneously) formed with a source electrode 27s and a drain electrode 27d of the TFT in FIG. 8.

The lower electrode 22 may be formed on an edge of the substrate 10, so as to be separated from and surround the plurality of TFTs.

The EML 30 is formed on the device/wiring layer 20, and includes the plurality of OLEDs 32.

The OLED 32 displays an image by emitting light according to driving signals received from the device/wiring layer 20, and includes the first electrode 31, the organic layer 33, and the second electrode 35.

The first electrode 31 functions as an anode, and the second electrode 35 functions as a cathode. However, the polarities of the first and second electrodes 31 and 35 may be the other way around.

The organic layer 33 is disposed between the first and second electrodes 31 and 35, and may include a low-molecular weight organic material or a high-molecular weight organic material.

The lower electrode 22 is the lower electrode of the capacitor for estimating the capacitance of the organic light-emitting display apparatus 2.

The encapsulating layer 40 is formed to completely cover the EML 30, and may be formed by alternately stacking at least one layer of the inorganic layer 41 and the organic layer 43.

The upper electrode 50 is provided on the encapsulating layer 40. The upper electrode 50 is formed on an edge of the encapsulating layer 40 so as to correspond to (or face) the lower electrode 34.

The upper electrode 50 is the upper electrode of the capacitor for estimating the capacitance of the organic light-emitting display apparatus 2. A width of the upper electrode 50 may be formed to be the same as that of the lower electrode 34, but is not limited thereto. The width of the upper electrode 50 may be different from that of the lower electrode 34.

Also, the upper electrode 50 may be formed by using the same material as that of the lower electrode 34.

The encapsulating layer 40 and the EML 30, which are disposed between the lower and upper electrodes 34 and 50, function as a dielectric material of the capacitor. When external oxygen or moisture penetrates into the encapsulating layer 40, a total thickness of the EML 30 and the encapsulating layer 40 is changed.

Therefore, the capacitance may be estimated according to variations in a total thickness of the encapsulating layer 40 and the EML 30. Even when it is difficult to detect a fault with the naked eye, early detection of a progressive error in the organic light-emitting display apparatus 2 is possible by estimating the capacitance.

FIG. 8 is an expanded view of portion A of FIG. 7.

Referring to FIG. 8, the device/wring layer 20 includes the TFT, and the lower electrode 22 of the capacitor.

The TFT includes a semiconductor layer 21, the gate electrode 25, and the source and drain electrodes 27s and 27d. The TFT illustrated in FIG. 8 is an example of a top-gate TFT. However, other types of TFTs such as a bottom-gate TFT may be provided.

When a top-gate TFT is provided, the semiconductor layer 21, a gate insulating film 23, the gate electrode 25, the lower electrode 22, an interlayer insulating film 26, a contact hole 27h, the source and drain electrodes 27s and 27d are sequentially formed on the substrate 10.

The semiconductor layer 21 may be formed of polysilicon. In this case, a set or predetermined region of the polysilicon may be doped with impurities. Alternatively, the semiconductor layer 21 may be formed of amorphous silicon, or various suitable organic semiconductor materials such as pentacene.

When the semiconductor layer 21 is formed by using polysilicon, amorphous silicon is formed first and then crystallized into polysilicon. The crystallization method may be rapid thermal annealing (RTA), solid phase crystallization (SPC), excimer laser annealing (ELA), metal induced crystallization (MIC), metal induced lateral crystallization (MILC), or sequential lateral solidification (SLS). However, when a plastic substrate is used in one or more embodiments of the present invention, a method which does not require a high-temperature annealing process may be used.

In order to insulate the semiconductor layer 21 from the gate electrode 25, the gate insulating film 23 is formed between the semiconductor layer 21 and the gate electrode 25. The gate insulating film 23 may be formed of an insulative material such as silicon oxide or silicon nitride, or an insulative organic material.

The gate electrode 25 and the lower electrode 22 may be concurrently (e.g., simultaneously) formed on the gate insulating film 23. The gate electrode 25 and the lower electrode 22 may be formed of various suitable conductive materials, such as Mg, Al, Ni, Cr, molybdenum (Mo), tungsten (W), MoW, or Au. In this case, the gate electrode 25 and the lower electrode 22 may be formed in various ways, for example, as a single or a multi-layer structure.

The interlayer insulating film 26 is formed to cover the gate electrode 25 and the lower electrode 22, which are formed on the gate insulating film 23. Also, the interlayer insulating film 26 may be formed of an insulative material such as silicon oxide or silicon nitride, or an insulative organic material.

The TFT is electrically connected to the first electrode 31 of the EML 30, via a contact 29.

A planarization film (a protective film and/or passivation layer) 28 is provided to cover the source and drain electrodes 27s and 27d, so that the TFT is protected and planarized. The planarization film 28 may be configured in various forms. The planarization film 28 may be formed of an organic material such as benzocyclobutene (BCB) or acrylate, or an inorganic material such as SiNx. Also, the planarization film 28 may be formed in various ways, for example, as a single, double or multi-layer structure.

Since the lower electrode 22 and the gate electrode 25 are concurrently (e.g., simultaneously) formed on the gate insulating film 23, the lower electrode 22 of the capacitor for estimating the capacitance of the organic light-emitting display apparatus 2 may be formed without an additional manufacturing process.

Figure 9:
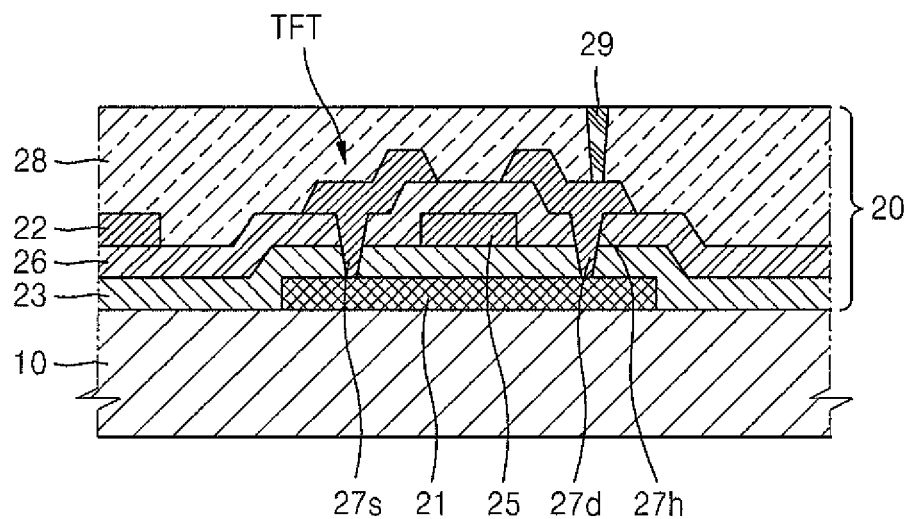
FIG. 9 is an expanded view of portion A of FIG. 7, according to another embodiment of the present invention.

FIG. 9 is an expanded view of portion A of FIG. 7, according to another embodiment of the present invention. Like reference numerals in FIGS. 8 and 9 denote like elements, and thus descriptions thereof will be omitted.

Referring to FIG. 9, the device/wiring layer 20 includes the TFT and the lower electrode 22 of the capacitor.

Unlike FIG. 8, the lower electrode 22 of FIG. 9 may be concurrently (e.g., simultaneously) formed with the source and drain electrodes 27s and 27d of the TFT. The lower electrode 22 is formed on an edge of the substrate 10 so as to surround the plurality of TFTs.

The lower electrode 22, and the source and drain electrodes 27s and 27d are formed on the interlayer insulating layer 26. The lower electrode 22 may be formed of the same material as that of the source and drain electrodes 27s and 27d.

The planarization film (the protection film and/or passivation layer) 28 is provided to cover the source and drain electrodes 27s and 27d, so that the TFT below the planarization film 28 is protected and planarized.

Figure 10:
FIGS. 10 through 12 are schematic cross-sectional views illustrating a method of manufacturing the organic light-emitting display apparatus of FIG. 7, according to another embodiment of the present invention.
Figure 11:
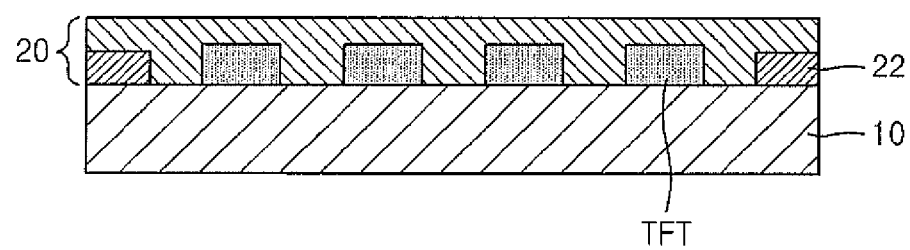
Figure 12:
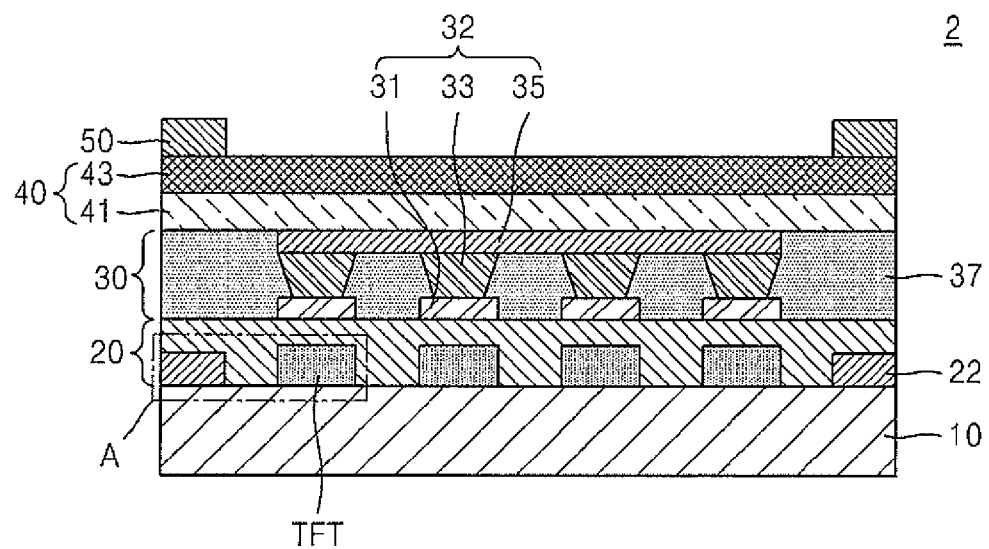

FIGS. 10 through 12 are schematic cross-sectional views illustrating a method of manufacturing the organic light-emitting display apparatus 2 of FIG. 7, according to another embodiment of the present invention.

Referring to FIG. 10, the substrate 10 is prepared. The substrate 10 may be formed by using transparent glass having $SiO_2$ as a main element, or other various suitable materials such as plastic materials or metal materials. However, the material of the substrate 10 is not limited thereto, and various flexible materials may be used.

Referring to FIG. 11, the device/wiring layer 20 and the lower electrode 22 are formed on the substrate 10.

The device/wiring layer 20 includes the plurality of TFTs, which drive the plurality of OLEDs 32 formed in the EML 30.

The lower electrode 22 is formed on an edge of the substrate 10, so as to be separated from and surround the plurality of TFTs.

As described in FIG. 8, the lower electrode 22 may be concurrently (e.g., simultaneously) formed with the gate electrode 25. Alternatively, as described in FIG. 9, the lower electrode 22 may be concurrently (e.g., simultaneously) formed with the source and drain electrodes 27s and 27d.

Referring to FIG. 12, the OLED 32 is formed on the device/wiring layer 20.

The OLED 32 includes the first electrode 31 that is electrically connected to the TFT of each sub-pixel; the second electrode 35 that functions as a common electrode that extends over all sub-pixels and is connected to each other; and the organic layer 33 that is disposed between the first and second electrodes 31 and 35.

Next, the encapsulating layer 40 is formed to cover the OLED 32.

The encapsulating layer 40 may be formed by alternately stacking at least one layer of the inorganic layer 41 and the organic layer 43.

Next, the upper electrode 50 is formed on the encapsulating layer 40 so as to correspond to (or face) the lower electrode 22.

A width of the upper electrode 50 may be formed to be the same as that of the lower electrode 34, but is not limited thereto. The width of the upper electrode 50 may be different from that of the lower electrode 34.

According to an inventive concept of the present invention, since the second electrode 35 and the lower electrode 34 may be concurrently (e.g., simultaneously) formed, a manufacturing process of the organic light-emitting display apparatus 2 may be simplified. Also, since the upper and lower electrodes 50 and 34 of the capacitor are formed in the upper and lower portions of the encapsulating layer 40, the capacitance may be estimated according to variations in the thickness of the encapsulating layer 40. Thus, it is possible to promptly detect whether or not external moisture or oxygen has penetrated into the organic light-emitting display apparatus 2.

Elements illustrated in the drawings above may be exaggerated or reduced to facilitate descriptions of the elements. Thus, the sizes or shapes of the elements of the present invention are not limited to those illustrated in the drawings. While the present invention has been particularly shown and described with reference to example embodiments thereof, it will be understood by those of ordinary skill in the art that various changes in form and details may be made therein without departing from the spirit and scope of the present invention as defined by the following claims, and equivalents thereof.

What is claimed is:

1. An organic light-emitting display apparatus comprising:
   a substrate;
   a device/wiring layer on the substrate, comprising a plurality of thin film transistors (TFTs);
   an emitting layer on the device/wiring layer, comprising a first capacitor electrode and a plurality of organic light-emitting diodes (OLEDs), the first capacitor electrode spaced apart from the plurality of OLEDs;
   an encapsulating layer covering the emitting layer; and
   a second capacitor electrode on the encapsulating layer, wherein the first and second capacitor electrodes and encapsulating layer together define a capacitor.

2. The organic light-emitting display apparatus of claim 1, wherein the organic light-emitting diode is formed by sequentially stacking a first OLED electrode, an organic layer, and a second OLED electrode.

3. The organic light-emitting display apparatus of claim 2, wherein the first capacitor electrode and the second OLED electrode are concurrently formed.

4. The organic light-emitting display apparatus of claim 1, wherein the first capacitor electrode and the second capacitor electrode face each other.

5. The organic light-emitting display apparatus of claim 1, wherein the encapsulating layer is formed by alternately stacking at least one layer of an inorganic layer and an organic layer.

6. The organic light-emitting display apparatus of claim 5, wherein the inorganic layer comprises silicon oxide, silicon nitride, silicon oxynitride, aluminum oxide, aluminum nitride, aluminum oxynitride, titanium oxide, titanium nitride, tantalum oxide, tantalum nitride, hafnium oxide, hafnium nitride, zirconium oxide, zirconium nitride, cerium oxide, cerium nitride, tin oxide, tin nitride, or magnesium oxide.

7. The organic light-emitting display apparatus of claim 5, wherein the organic layer comprises an acrylic-based resin, a methacrylic-based resin, an isoprene-based resin, a vinyl-based resin, an epoxy-based resin, a urethane-based resin, a cellulose-based resin, a perylene-based resin, an imide-based resin, or a compound thereof.

8. An organic light-emitting display apparatus comprising:
   a substrate;
   a device/wiring layer on the substrate, comprising a plurality of thin film transistors (TFTs);
   an emitting layer on the device/wiring layer, comprising a first capacitor electrode and a plurality of organic light-emitting diodes (OLEDs);
   an encapsulating layer covering the emitting layer; and
   a second capacitor electrode on the encapsulating layer, wherein the first and second capacitor electrodes and encapsulating layer together define a capacitor, wherein the first capacitor electrode is on an edge of the device/wiring layer, separated from and surrounding the plurality of OLEDs.

* * * * *